(12) United States Patent
Toyota et al.

(10) Patent No.: US 8,264,242 B2
(45) Date of Patent: Sep. 11, 2012

(54) PROXIMITY SENSOR AND ROTATIONAL OPERATION DETECTING DEVICE

(75) Inventors: Naoki Toyota, Yao (JP); Yasuhiro Shigeno, Yao (JP)

(73) Assignee: Hosiden Corporation, Osaka (JP)

( * ) Notice: Subject to any disclaimer, the term of this patent is extended or adjusted under 35 U.S.C. 154(b) by 335 days.

(21) Appl. No.: 12/716,691

(22) Filed: Mar. 3, 2010

(65) Prior Publication Data

US 2010/0231238 A1  Sep. 16, 2010

(30) Foreign Application Priority Data

Mar. 11, 2009  (JP) ................................. 2009-058129

(51) Int. Cl.
*G01R 27/26* (2006.01)
(52) U.S. Cl. ....................................... 324/662; 324/658
(58) Field of Classification Search .................. 324/662, 324/661, 658, 649, 600
See application file for complete search history.

(56) References Cited

U.S. PATENT DOCUMENTS

| | | | |
|---|---|---|---|
| 6,949,937 B2 * | 9/2005 | Knoedgen | 324/658 |
| 7,501,834 B2 * | 3/2009 | Madni et al. | 324/658 |
| 7,531,921 B2 | 5/2009 | Cencur | |
| 7,705,611 B2 * | 4/2010 | Ogata et al. | 324/661 |
| 2008/0001649 A1 | 1/2008 | Cencur | |
| 2009/0057124 A1 * | 3/2009 | Orsley et al. | 200/600 |

FOREIGN PATENT DOCUMENTS

| | | |
|---|---|---|
| DE | 10131243 C1 | 11/2002 |
| JP | 2001035327 A | 2/2001 |
| JP | 20084465 A | 1/2008 |
| WO | 9731238 | 8/1997 |
| WO | 03003581 A1 | 1/2003 |
| WO | 2007150058 A2 | 12/2007 |

* cited by examiner

*Primary Examiner* — Hoai-An D Nguyen
(74) *Attorney, Agent, or Firm* — The Webb Law Firm

(57) ABSTRACT

A proximity sensor for determining an approaching direction of an object is provided. Relative detection sensitivity is established in a first detection unit and a second detection unit such that a detection level of the first detection unit is greater than a detection level of the second detection unit when the object approaches from a first electrode in a direction of arranging the first electrode and a second electrode, and that the detection level of the second detection unit is greater than the first detection unit when the object approaches from a direction perpendicular to the direction of arranging the first electrode and the second electrode. A proximity position determining section is adapted to determine the approaching direction of the object based on the detection level of the first detection unit and the detection level of the second detection unit.

7 Claims, 4 Drawing Sheets

PROXIMITY SENSOR AND ROTATIONAL OPERATION DETECTING DEVICE

CROSS REFERENCE TO RELATED APPLICATIONS

This application is based on and claims priority under 35 U.S.C. Section 119 to Japanese Patent Application No. 2009-058129 filed on Mar. 11, 2009, the entire content of which is incorporated herein by reference.

FIELD OF THE INVENTION

The present invention relates to a proximity sensor for detecting approach of an object based on capacitance, and a rotational operation detecting device using the proximity sensor.

BACKGROUND OF THE INVENTION

One conventional example of a proximity sensor for detecting approach of an object based on capacitance is disclosed in Japanese Unexamined Patent Application Publication No. 2001-35327 A (Patent Document 1). The proximity sensor comprises a bottomed tubular fixed shield electrode 2, a disk-like detection substrate 7 provided at an opening end of the fixed shield electrode 2, a detection electrode 1 mounted on a central portion of the detection substrate 7 to face an object 11 to be detected, and a movable shield electrode 5 mounted outwardly of the fixed shield electrode 2 to be slidable along an axial direction of the tubular electrodes. In this proximity sensor, the movable shield electrode 5 is slid to adjust amount of projection from the fixed shield electrode 2 toward the object 11 to be detected thereby maintaining the detection electrode 1 and the movable shield electrode 5 in substantially the same potential. (The reference numbers used in this section are cited from Patent Document 1.)

With the above proximity sensor, a shielded portion that is covered by the shield electrode 5 and formed in a predetermined range of a side of the detection electrode 1 to extend from the detection electrode 1 toward the object to be detected is variable. Thus, it becomes possible to adjust an area, by the shield electrode 5, where an electric flux line formed between the detection electrode 1 and the object to be detected might undergo some influences.

The capacitance-type proximity sensor does not serve to exactly measure the distance to the object. On the other hand, the capacitance-type proximity sensor is superior in decay durability, dust tightness and simplicity in structure, dispensing with any electrical contact and further dispensing with mated light source and light-sensitive element as required in an optical proximity sensor using infrared rays, for example. Thus, the capacitance-type proximity sensor is effective for use in recognizing the presence of the object.

In the capacitance-type proximity sensor, the approach of the object is detected by variations of capacitance when the object approaches the electrode. Thus, it is difficult in the capacitance-type proximity sensor to accurately determine a detecting area relating to directional characteristics only with change of the configuration of the electrode. As a result, the capacitance-type proximity sensor may additionally require a shield exerting the influences on the electrode as described in Patent Document 1.

However, the provision of the shield easily contributes to increase of the size of the proximity sensor and thus leaves room for improvement. In particular, the proximity sensor capable of recognizing the object approaching from different directions is desired while such a sensor might be complicated as long as the shield is required.

Here, taking a rotary-type knob equipped with an electric device into consideration, it is also desired to provide a device using a proximity sensor capable of distinguishing between the case where the user rotates the knob properly and the case where the knob is unintentionally rotated when a sleeve of the user's clothing or part of the user's body contacts the knob.

SUMMARY OF THE INVENTION

As noted above, it is desired to provide a proximity sensor capable of determining an approaching direction of an object.

A characteristic feature of the present invention lies in a proximity sensor for detecting approach of an object based on capacitance, including:

an electrode section including a first electrode and a second electrode arranged adjacent to each other;

a detecting section including a first detection unit for detecting approach of the object based on variations in capacitance of the first electrode, and a second detection unit for detecting approach of the object based on variations in capacitance of the second electrode, wherein relative detection sensitivity is established in the first detection unit and the second detection unit such that a detection level of the first detection unit is greater than a detection level of the second detection unit when the object approaches from the first electrode in a direction of arranging the first electrode and the second electrode, and that the detection level of the second detection unit is greater than the first detection unit when the object approaches from a direction perpendicular to the direction of arranging the first electrode and the second electrode; and a proximity position determining section for determining the approaching direction of the object based on the detection level of the first detection unit and the detection level of the second detection unit.

With this arrangement, the proximity position determining section is provided for establishing the relative detection sensitivity for the first unit having the first electrode and the second unit having the second electrode to determine the position of the object based on the detection levels from the first unit and second unit. This makes it possible to determine the approaching direction of the object based on the determination results received from the proximity position determining section without providing the shield and the like. As a result, the proximity sensor capable of determining the approaching direction of the object can be easily achieved.

In the proximity sensor of the present invention, the relative detection sensitivity may be established by determining detection performance of the first detection unit and the second detection unit or by determining configurations of the first electrode and the second electrode. With such an arrangement, the relative sensitivity is achieved in response to the mode of use or the condition in use by establishing the detection sensitivity by the first detection unit and the second detection unit, or by determining the configurations of the first electrode and the second electrode, or by the combination thereof.

The proximity sensor of the present invention may further comprise a belt-like ground electrode provided in the electrode section and having a longitudinal section extending along a peripheral direction of a tubular substrate, wherein the belt-like first electrode and second electrode are arranged on the substrate along the peripheral direction with the ground electrode between them and parallel with the ground electrode.

With this arrangement, it is possible to form the first electrode, the ground electrode and the second electrode on the tubular substrate in the mentioned order. For example, it makes it possible not only to facilitate fabrication of the sensor compared with the arrangement in which an electrode and an insulating material are layered but also to align the arranging direction of the first electrode and the second electrode with an axial direction of the tubular substrate. As a result, it is possible to distinguish between the approach of the object from a direction along the axial direction and the approach of the object from a direction perpendicular to the axial direction.

Further, a characteristic feature of a rotational operation detecting device of the present invention having a rotation detecting section for detecting a rotational operation of a rotationally-operable knob about an axis, the rotational operation detecting device comprising:

a first electrode arranged inside the knob at a distal end of the axis in a direction along the axis;

a second electrode arranged inside the knob at a proximal end of the axis in a direction along the axis;

a detection section including a first detection unit for detecting approach of an object based on variations in capacitance of the first electrode and a second detection unit for detecting approach of the object based on variations in capacitance of the second electrode, wherein relative detection sensitivity is established such that a detection level of the first detection unit is greater than a detection level of the second detection unit when the object approaches from the first electrode in a direction along the axis and that the detection level of the second detection unit is greater than the first detection unit when the object approaches from a direction perpendicular to the direction along the axis;

a proximity position determining section for determining the approaching direction of the object based on the detection level of the first detection unit and the detection level of the second detection unit; and an output control section for allowing output of signals from the rotation detection section only when a rotational operation is detected in the rotation detection section when the proximity position determining section detects approach of the object from the direction perpendicular to the axis.

With this arrangement, the detection level of the first detection unit becomes higher than the detection level of the second detection unit when the object approaches from the distal end along the axis of the knob. On the other hand, the detection level of the second detection unit becomes higher than the detection level of the first detection unit when the object approaches from the direction perpendicular to the axis of the knob. The proximity position determining section is adapted to recognize the difference in detection level, thereby distinguishing between the state where the user pinches or grips the knob to rotate the knob and the sate the sleeve of the user's clothing or part of the user's body contacts an end portion of the knob to rotate the knob. The output control section allows output of signals from the rotation detection section only when it can be determined that the user intentionally has operated the knob based on the determination results from the proximity position determining section. As a result, the rotational operation detecting device is capable of disregarding operations executed unintentionally by the user and extracting only the amount of rotation resulting from proper operations.

Still further, the rotational operation detecting device of the present invention may comprise a sheet-like substrate that is flexibly deformable, wherein a belt-like ground electrode is formed on the substrate in a predetermined direction, the belt-like first electrode and second electrode being formed on the substrate with the ground electrode between them and parallel with the ground electrode, and wherein the substrate has a tubular shape to be fitted into the interior of the knob, on which the belt-like ground electrode as well as the belt-like first electrode and second electrode are arranged in a peripheral direction centering the axis.

With such an arrangement, since the sheet-like substrate with the electrodes being formed thereon has a tubular shape to be fitted into the interior of the knob, it is not required to form the electrode directly in the interior of the knob. As a result, the capacitance-type sensor may be easily fabricated.

DETAILED DESCRIPTION OF THE INVENTION

Embodiments of the present invention will be described hereinafter in reference to the accompanying drawings.

Figure 1:
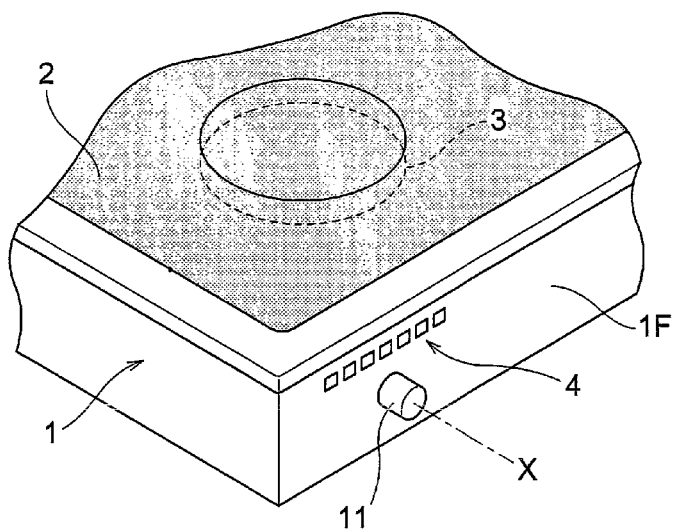
FIG. 1 is a perspective view showing part of an IH cooking heater.
Figure 6:
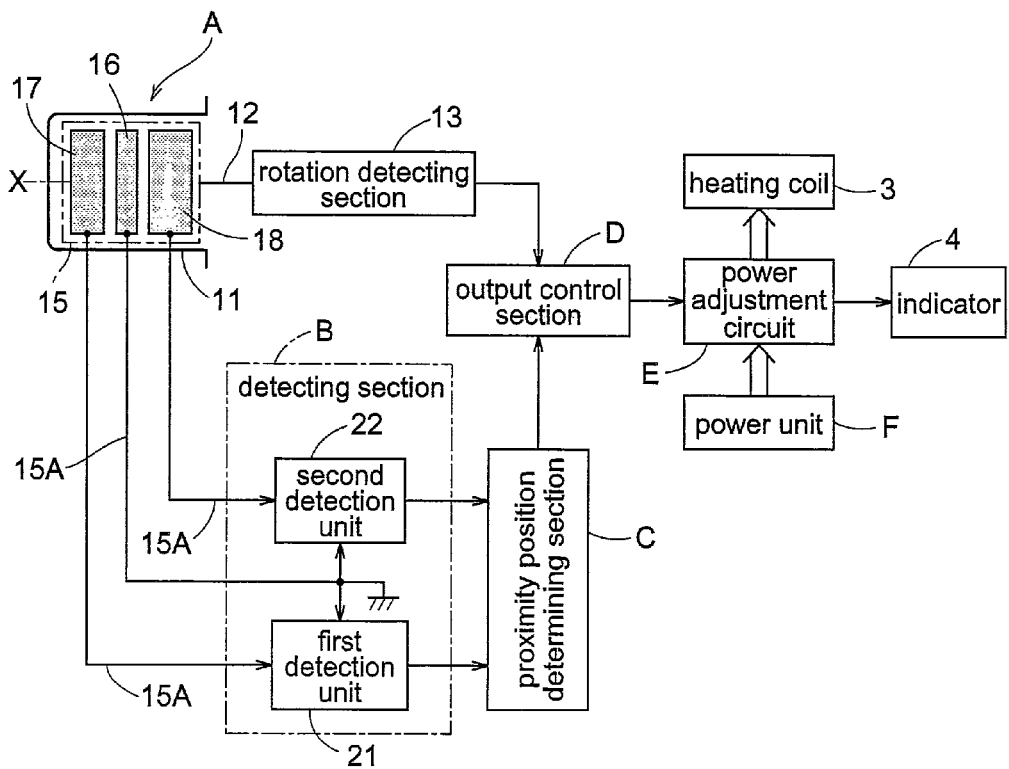
FIG. 6 is a circuitry diagram of the rotational operation detecting device.

FIG. 1 shows an NI (Induction Heating) cooking heater as one example of equipment provided with a rotational operation detecting device. The IH cooking heater comprises a housing 1 forming a main body, a top plate 2 made of heat-resistant glass and mounted on a top surface of the housing 1, and a heating coil 3 mounted on a bottom surface of the top plate 2. An electric power control system (power adjustment circuit E in FIG. 6) is provided within the housing 1 for supplying electric power intermittently to the heating coil 3. Further, the housing 1 includes a front panel 1F having a rotationally-operable knob 11 for desirably setting electric power to be supplied to the heating coil 3 by the electric power control system, and an indicator 4 for indicating the electric power supplied to the heating coil 3 by the number of illuminated light-emitting diodes.

The knob 11 forms part of the constitution of the rotational operation detecting device in accordance with the present invention which is made of resin or ceramics and includes a capacitance-type proximity sensor therein for determining a mode of operation performed by the user. Due to the provision of the proximity sensor, when the user pinches an outer periphery of the knob 11 with the thumb or fingers or grips the knob with the hand to rotate the knob 11, the proximity sensor detects the mode of such an operation. The electric power control system supplies electric power corresponding to such a rotational operation to the heating coil 3. On the other hand, the knob is sometimes rotated against the user's will when a sleeve of the user's clothing or part of the user's body inadvertently contacts an end portion of the knob 11. If such a state is detected by the proximity sensor, the rotational operation detecting device functions to avoid variations in output (electric power to be supplied) resulting from the rotation of the knob 11.

A product provided with the rotational operation detecting device of the present invention is not limited to the cooking heater. The rotational operation detecting device may be generally used in any equipment having the knob such as an audio apparatus having the sound-volume knob.

As shown in FIGS. 1 to 6, the rotational operation detecting device comprises a rotation detecting section 13 including an incremental rotary encoder that is connected to the knob 11 through a rotary shaft 12, an electrode section A mounted in the interior of the knob 11, a detecting section B detecting approach of a human's finger or hand as an object based on capacitance of the electrode section A, a proximity position determining section C for determining the position of the object based on detection signals received from the detecting section B, and an output control section D to which determination signals from the proximity position determining section C are inputted. The rotation detecting section 13 is supported by a frame 5 mounted in the interior of the housing 1.

In the present embodiment, the proximity position determining section C and the output control section D are separated. Instead, those sections may be formed as a single module using hardware constituted by a logical circuit such as a comparator or a logical gate. Further, those sections may be constituted by software (program) or a combination of hardware and software. Naturally, a processor such as a microcomputer may be used as the hardware.

In the present embodiment, the proximity sensor comprises the electrode section A, the detecting section B and the proximity position determining section C. The determination results received from the proximity position determining section C are provided to the output control section D of the rotational operation detecting device along with the detection results received from the rotation detecting section 13. The IH cooking heater in accordance with the present embodiment is provided with a power adjustment circuit E for receiving signals from the output control section D. The power adjustment circuit E is adapted to adjust electric power supplied from a power unit F based on signals received from the output control section D while being adapted to create intermittent signals that are provided in turn to the heating coil 3. The output power value established (adjusted) by the power adjustment circuit E is indicated in the indicator 4. The indicator 4 increases the number of the illuminated light-emitting diodes as the output power value increases.

Figure 5:
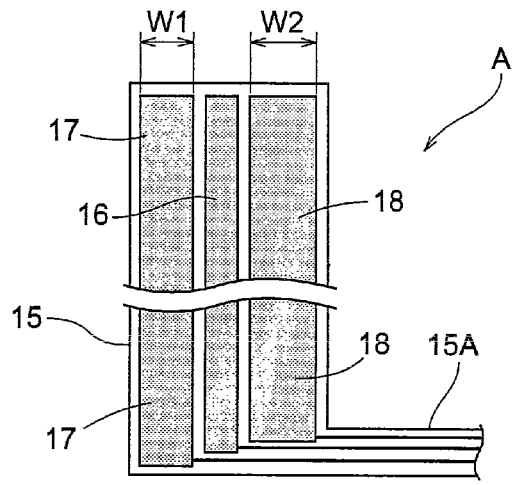
FIG. 5 shows a substrate having electrodes formed thereon.

As shown in FIG. 5, the electrode section A includes a ground electrode 16, a first electrode 17, and a second electrode 18. Each of those electrodes is formed by printed wiring technique, using metal foil consisting of a good conductor such as copper foil, as a belt-like element to extend in a predetermined direction on a sheet-like substrate 15 made of resin to be flexibly deformable. The first electrode 17 and the second electrode 18 are arranged with the ground electrode 16 between them and parallel with and spaced apart from the ground electrode 16. It should be noted that the substrate 15 may not be necessarily flexibly deformable, but may be a metal thin film formed on an outer periphery of a tubular resin pipe. Further, it is possible to affix metal foil or form a metal film on the substrate by vapor deposition technique to form the electrodes.

In the electrode section A, the ground electrode 16 and the first electrode 17 function as a capacitor (first capacitor) while the ground electrode 16 and the second electrode 18 function as a capacitor (second capacitor). Lead wiring sections 15A are formed integrally with an end portion of the substrate 15 for conducting to the ground electrode 16, the first electrode 17 and the second electrode 18, respectively. The ground electrode 16, the first electrode 17 and the second electrode 18 are electrically connected to the detecting section B through the lead wiring sections 15A, respectively.

In this embodiment, the first electrode 17 has a smaller width W1 than a width W2 of the second electrode 18 such that the detection sensitivity of the second capacitor having the second electrode 18 may be greater than the first capacitor having the first electrode 17. More particularly, as described later, relative detection sensitivity is established in the detection section B such that the detection level of a first detection unit 22 may be greater than the detection level of a second detection unit 21 in a direction perpendicular to the direction of arranging the first electrode 17 and the second electrode 18. As one preferable embodiment for establishing the relative detection sensitivity, the configurations of the first electrode 17 and the second electrode 18 (the widths W1 and W2, for example) are determined.

A tubular support element 19 for supporting the knob 11 is provided in a front surface of the front panel 1F of the IH cooking heater. A space is formed in a radial central portion of the support element 19 to receive the rotary shaft 12 of the rotation detecting section 13. The support element 19 has a dimension such that the entire support element 19 is completely fitted into the interior space of the knob 11. The support element 19 is made of resin and has a plurality of engaging elements 19A formed integrally therewith to form the tubular shape. The engaging elements 19A have a retainer construction (claws) provided in a proximal portion of the support element 19 positioned adjacent to the interior of the cooking heater. The support element 19 is fixed to the front panel 1F with the engaging elements 19A engaging engageable holes 1A formed in the front panel 1F.

Figure 2:
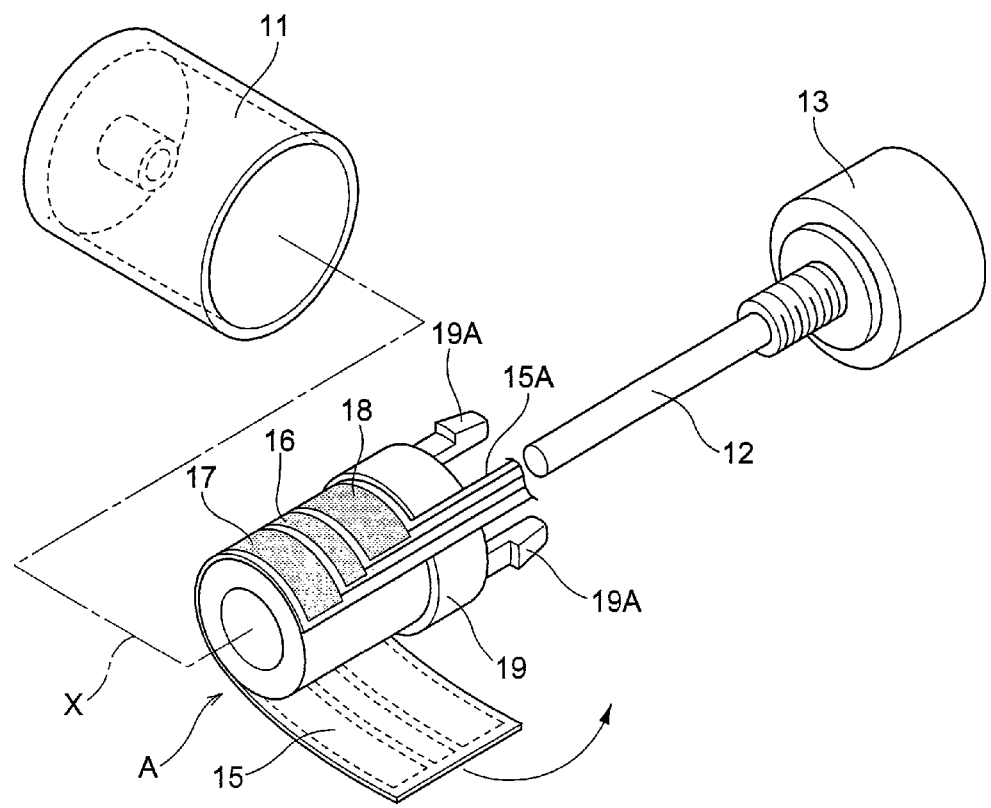
FIG. 2 is an exploded perspective view showing a construction of a rotational operation detecting device using a proximity sensor.
Figure 3:
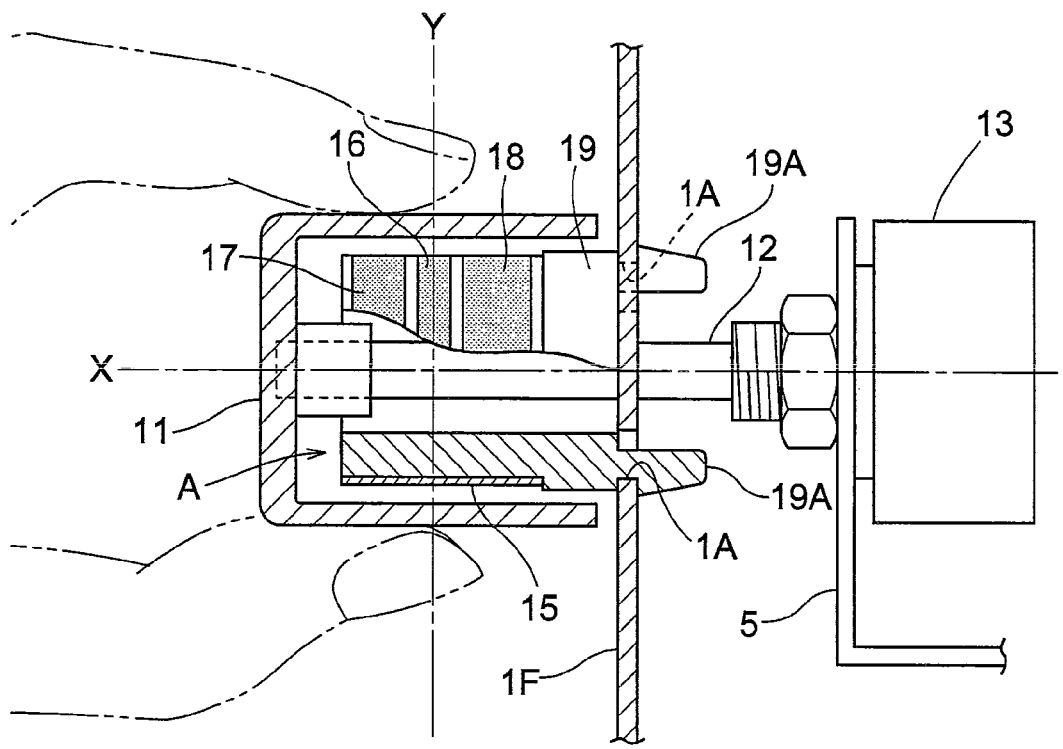
FIG. 3 is a sectional view of a knob housing the proximity sensor therein.
Figure 4:
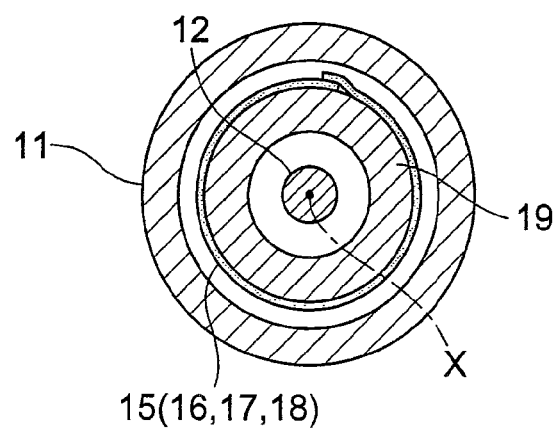
FIG. 4 is a vertical section of the knob.

As shown in FIGS. 2 and 3, the electrode section A is provided in the interior space of the knob 11 with the sheet-like resin substrate 15 being wound around and fixed to an outer periphery of the support element 19. Here, the substrate 15 is fixed to the support element 19 such that the first electrode 17 and the second electrode 18 satisfy the following positional relationship in a direction along an axis X of the rotary shaft 12 of the rotation detecting section 13. That is to say, the first electrode 17 should be arranged adjacent to a distal end of the support element 19 and the rotary shaft 12 while the second electrode 18 should be arranged adjacent to a proximal end of the support element 19 and the rotary shaft 12. Since the ground electrode 16 is arranged between the first electrode 17 and the second electrode 18, the ground electrode 16, the first electrode 17 and the second electrode 18 are formed along a peripheral direction that coincides with a longitudinal direction thereof centering the axis X.

The detecting section B includes the first detection unit 21 and the second detection unit 22. The first detection unit 21 is electrically connected to the first electrode 17 through the lead wiring section 15A while the second detection unit 22 is electrically connected to the second electrode 18 through the lead wiring section 15A. Further, the ground of the detecting section B is electrically connected to the ground electrode 16 through the leading wiring section 15A. The ground of the detecting section B represents reference potential of the first detection unit 21 and the second detection unit 22. Thus, the ground electrode 16 is also electrically connected to the first detection unit 21 and the second detection unit 22 through the lead wiring sections 15A.

As noted above, the width W1 of the first electrode 17 is smaller than the width W2 of the second electrode 18 in the present embodiment. Thus, the detection sensitivity is different between the first detection unit 21 and the second detection unit 22, even if the detection performance (gain, for example) is the same between those units. On the other hand, the detection performance may be adjusted as necessary to provide the difference in detection performance between the first detection unit 21 and the second detection unit 22. Naturally, when the width W1 of the first electrode 17 is the same as the width W2 of the second electrode 18, it is possible to adjust the detection performance and provide the difference in detection performance between the first detection unit 21 and the second detection unit 22 to differentiate the detection sensitivity between those units. It is preferable that the first detection unit 21 and the second detection unit 22 are formed having a capacitance detection IC (integrated circuit) as a core in which the detection performance such as gain can be adjusted with a resistor or a capacitor externally attached to the IC.

With the proximity sensor of the present embodiment, the relative detection sensitivity is established such that the detection level of the first detection unit 21 becomes greater than the detection level of the second detection unit 22 when the object approaches the distal end of the rotation detecting section 13 in the direction along the axis X of the rotary shaft 12 and that the detection level of the second detection unit 22 becomes greater than the detection level of the first detection unit 21 when the object approaches from the direction along a plane Y perpendicular to the direction of arranging the first electrode 17 and the second electrode 18 (direction along the axis X). The detection level in the present embodiment means a voltage level.

Figure 7:
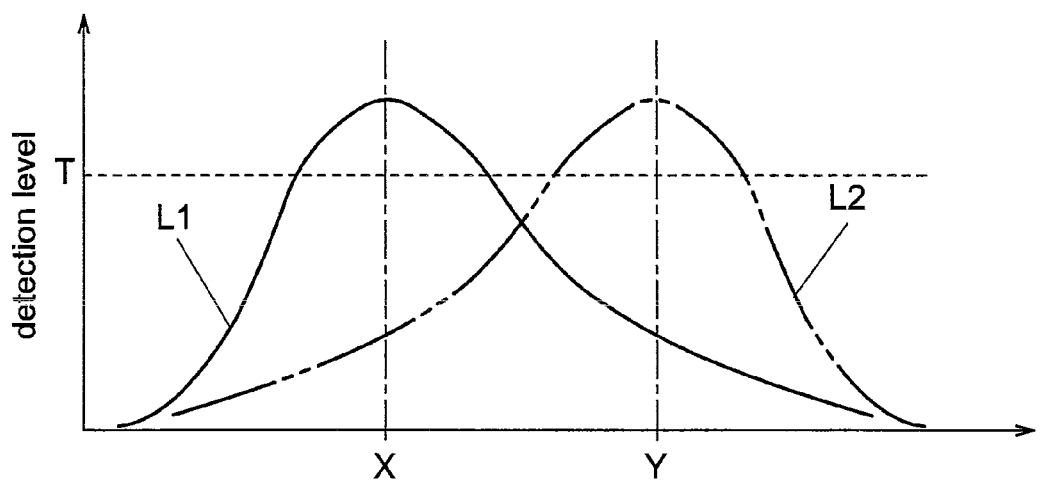
FIG. 7 is a graphic representation schematically showing detection levels of a first electrode and a second electrode.

As shown in FIG. 7, it is possible to indicate the detection sensitivity in the case where the object approaches from the distal end along the axis X and in the case where the object approaches along the plane Y perpendicular to the axis X, as a schematic graphic representation defining the axis of abscissas as the direction of approach. The point "X" shown in the axis of abscissas in FIG. 7 represents the direction in which the object approaches from the distal end along the axis X while the point "Y" shown in the axis of abscissas in FIG. 7 represents the direction in which the object approaches in the direction perpendicular to the axis X, preferably from between the first electrode 17 and the second electrode 18. FIG. 7 also shows the detection level of the first detection unit 21 as "L1" and the detection level of the second detection unit 22 as "L2". It is possible to determine the approaching direction of the object by setting a threshold T at the proximity position determining section C and obtaining the information on the relationship in magnitude between the detection level L1 and the detection level L2 when either of the detection level L1 and the detection level L2 exceeds the threshold T.

The proximity position determining section C is adapted to determine that the object approaches from the distal end of the knob 11 in the direction along the axis X when the detection level L1 of the first detection unit 21 exceeds the threshold T. Since the determination is made when either the detection level L1 or the detection level L2 exceeds the threshold T, the detection level L1 of the first detection unit 21 is greater than the detection level L2 of the second detection unit 22 in this case. This kind of approach is referred to as "distal-end proximity" hereinafter.

In contrast, the proximity position determining section C is adapted to determine that the object approaches from the direction perpendicular to the axis X when the detection level L2 of the second detection unit 22 exceeds the threshold T. Since the determination is made when either the detection level L1 or the detection level L2 exceeds the threshold T, the detection level L2 of the second detection unit 22 is greater than the detection level L1 of the first detection unit 21 in this case. This kind of approach is referred to as "peripheral proximity" hereinafter.

The output control section D is adapted to output detection signals from the rotation detecting section 13 directly to the power adjustment circuit E when the proximity position deterring section C regards the condition as the "peripheral proximity". In other words, the output control section D permits the detection signals from the rotation detecting section 13 to be outputted to the power adjustment circuit E. On the other hand, the output control section D is adapted to prohibit the detection signals from the rotation detecting section 13 from being outputted when the proximity position determining section C regards the condition as the "distal-end proximity". In other words, the output control section D does not permit the detection signals from the rotation detecting section 13 to be outputted to the power adjustment circuit E. The output control section D is also adapted to prevent output of the detection signals from the rotation detecting section 13 as well when the proximity position determining section C regards the condition neither as the "peripheral proximity" nor as the "distal-end proximity", that is to say, when neither the detection level of the first detection unit 21 nor the detection level of the second detection unit 22 exceed the threshold T. In other words, the output control section D does not permit the detection signals from the rotation detecting section 13 to be outputted to the power adjustment circuit E.

When the object approaches the outer peripheries of the knob 11 along the plane Y, the proximity position determining section C regards the condition as the "peripheral proximity". Thus, when the knob 11 is rotated, the amount of rotation is transmitted to the power adjustment circuit E through the output control section D. The power adjustment circuit E adjusts electric power to be supplied to the heating coil 3 based on the amount of rotation.

On the contrary, when the object approaches from the distal end of the knob 11 along the axis X, the proximity position determining section C regards the condition as the "distal-end proximity". Hence, such rotational movement is regarded as it is against the user's will even if the knob 11 is rotated. Thus, the output from the output control section D does not change and the amount of rotation is not transmitted to the power adjustment circuit E. As a result, the rotational movement of the knob 11 does not reflect on the power adjustment by the power adjustment circuit E to keep electric power to be supplied to the heating coil 3 unchanged.

In the present embodiment, since the first electrode 17 and the second electrode 18 are formed on the sheet-like substrate 15 that is flexibly deformable by the printed wiring technique, those electrodes may be fabricated more easily than those fabricated using a plurality of metal sheets, for example. Further, the sheet-like substrate 15 that is flexibly deformable may be formed as a tubular member and arranged within the knob easily.

With the rotational operation detecting device, it is required to avoid detecting the rotational movement of the knob 11 against the user's will as much as possible while to detect the rotational movement of the knob 11 against the user's will appropriately. Therefore, it is effective that the detection sensitivity in the first detection unit 21 and the second detection unit 22 is established properly such that the detection level exceeds the threshold T when the user's hand contacts the peripheries or the distal end of the knob 11. In addition, it is effective that, when neither the detection level of the first detection unit 21 nor the detection level of the second detection unit 22 exceed the threshold T, the output control section D does not output signals from the rotation detection section 13 regarding that the knob 11 is not contacted by the user's hand.

It should be noted that the proximity sensor may be switchable between a directional identification mode for allowing distinction between the peripheral proximity and the distal-end proximity, and a non-directional mode for allowing detection of approach from any directions whenever the object approaches the detecting section B. Where the proximity sensor is activated in the non-directional mode, it is preferable to set the sum of the detection level L1 of the first detection unit 21 and the detection level L2 of the second detection unit 22 as the detection value. Naturally, only one of the detection levels of the first detection unit 21 and the second detection unit 22 may be set as the detection value. Further, it is also possible to detect the approach of the object when one of the detection level of the first detection unit 21 and the detection level of the second detection unit 22 exceeds the threshold T.

[Alternative Embodiments]

The present invention may be carried out as follows without being limited to the above-noted embodiment.

Figure 8:
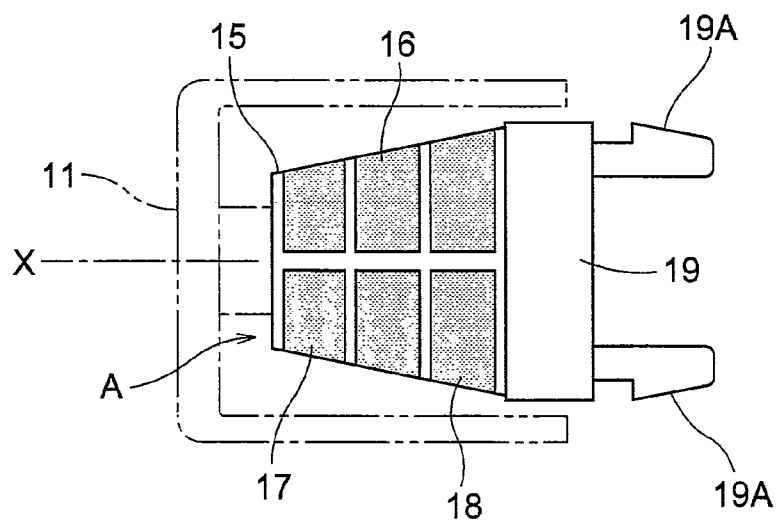
FIG. 8 is a side view showing a construction of the proximity sensor in accordance with an alternative embodiment.

(a) As shown in FIG. 8, each of the first electrode 17 and the second electrode 18 may have an inclined profile with its outer surface extending along an outer surface of the conical shape of the support element. In this, the second electrode 18 should have an outer diameter larger than an outer diameter of the first electrode 17 such that the detection sensitivity of the second detection unit 22 may higher than the detection sensitivity of the first detection unit 21. With this, when the object approaches from the direction perpendicular to the axis X, the distance between the second electrode 18 and the object becomes smaller inevitably than the distance between the first electrode 17 and the object. Therefore, the detection sensitivity of the second detection unit 22 is higher than the detection sensitivity of the first detection unit 21 even if the detection performance (gain, for example) is set equally between the first detection unit 21 and the second detection unit 22.

(b) In forming the rotational operation detecting device, a metal thin film may be formed directly on the inner surface of the knob to form the electrode section A. With this arrangement, it is preferable to connect the electrode section A to the detection section B through a flexible cable, for example, to allow rotation of the knob 11.

(c) In forming the rotational operation detecting device, metal foil may be formed on the outer periphery of the support element 19 as shown in the above-noted embodiment to form the electrode section A directly on the outer peripheral surface of the support element 19.

The proximity sensor for detecting approach of the object is achieved by the present invention as described above. It should be noted that the proximity sensor in accordance with the present invention may applied not only to the knob that is manually rotated but also to detect the mode of operation in a grip of a lever.

What is claimed is:

1. A proximity sensor for detecting approach of an object based on capacitance, comprising:
   an electrode section including a first capacitor and a second capacitor arranged adjacent to each other;
   a detecting section including a first detection unit for detecting approach of the object based on variations in capacitance of the first capacitor, and a second detection unit for detecting approach of the object based on variations in capacitance of the second capacitor, wherein relative detections sensitivity in the first detection unit and the second detection unit are such that a detection level detected by the first detection unit is greater than a detection level detected by the second detection unit when the object approaches the electrode section from a first direction, and that the detection level detected by the second detection unit is greater than the detection level detected by the first detection unit when the object approaches the electrode section from a second direction perpendicular to the first direction; and
   a proximity position determining section for determining the approaching direction of the object based on the detection level of the first detection unit and the detection level of the second detection unit.

2. The proximity sensor as defined in claim 1, wherein the relative detection sensitivity is established by determining detection performance of the first detection unit and the second detection unit or by determining configurations of the first capacitor and the second capacitor.

3. The proximity sensor as defined in claim 1, wherein the electrode section is comprised of:
   a belt-like first electrode arranged along a peripheral section of a tubular section;
   a belt-like second electrode arranged along the peripheral section of the tubular section; and
   a belt-like ground electrode arranged along the peripheral section of the tubular section between the first electrode and the second electrode.

4. The proximity sensor as defined in claim 3, wherein:
   the first capacitor is comprised of the first electrode and the ground electrode; and
   the second capacitor is comprised of the second electrode and the ground electrode.

5. A rotational operation detecting device having a rotation detecting section for detecting a rotational operation of a rotationally-operable knob about an axis, the rotational operation detecting device comprising:
   a first capacitor arranged inside the knob at a distal end of the axis in a direction along the axis;
   a second capacitor arranged inside the knob at a proximal end of the axis in a direction along the axis;
   a detection section including a first detection unit for detecting approach of an object based on variations in capacitance of the first capacitor and a second detection unit for detecting approach of the object based on variations in capacitance of the second capacitor, wherein relative detection sensitivities of the first and second detection units are such that a detection level detected by the first detection unit is greater than a detection level detected by the second detection unit when the object approaches from a first direction along the axis, and that the detection level detected by the second detection unit is greater than the detection level detected by the first detection unit when the object approaches from a second direction perpendicular to the first direction;
   a proximity position determining section for determining the approaching direction of the object based on the detection level of the first detection unit and the detection level of the second detection unit; and
   an output control section for allowing output of signals from the detection section only when a rotational operation of the knob is detected in the detection section when the proximity position determining section detects approach of the object from the second direction.

6. The rotational operation detecting device as defined in claim 5 further comprising a sheet-like substrate that is flexibly deformable, wherein a belt-like ground electrode is formed on the substrate in a predetermined direction, and belt-like first and second electrodes are formed on the substrate with the ground electrode between them and parallel with the ground electrode, and wherein the substrate has a tubular shape to be fitted into the interior of the knob, on which the belt-like ground electrode and the belt-like first and second electrodes are arranged in a peripheral direction centering the axis.

7. The proximity sensor as defined in claim 5, wherein:

the first capacitor is comprised of the first electrode and the ground electrode; and the second capacitor is comprised of the second electrode and the ground electrode.

\* \* \* \* \*

UNITED STATES PATENT AND TRADEMARK OFFICE
CERTIFICATE OF CORRECTION

| | | |
|---|---|---|
| PATENT NO. | : 8,264,242 B2 | Page 1 of 1 |
| APPLICATION NO. | : 12/716691 | |
| DATED | : September 11, 2012 | |
| INVENTOR(S) | : Naoki Toyota | |

It is certified that error appears in the above-identified patent and that said Letters Patent is hereby corrected as shown below:

Column 12, Line 1, Claim 7, delete "proximity sensor" and insert -- rotational operation detecting device --

Column 12, Line 1, Claim 7, delete "claim 5" and insert -- claim 6 --

Signed and Sealed this
Eleventh Day of December, 2012

David J. Kappos
*Director of the United States Patent and Trademark Office*